United States Patent
Yahav et al.

(10) Patent No.: US 8,744,385 B2
(45) Date of Patent: Jun. 3, 2014

(54) EFFICIENT REDUCTION OF LOCAL OSCILLATOR LEAKAGE

(75) Inventors: Nir Yahav, Holon (IL); Ofer Rahmanony, Holon (IL)

(73) Assignee: Provigent Ltd, Herzliya (IL)

( * ) Notice: Subject to any disclaimer, the term of this patent is extended or adjusted under 35 U.S.C. 154(b) by 716 days.

(21) Appl. No.: 12/551,575

(22) Filed: Sep. 1, 2009

(65) Prior Publication Data

US 2011/0053547 A1 Mar. 3, 2011

(51) Int. Cl.
*H03J 7/32* (2006.01)

(52) U.S. Cl.
USPC ............ 455/147; 455/208; 455/258; 342/100

(58) Field of Classification Search
USPC .................. 455/317, 147, 208, 258; 342/100
See application file for complete search history.

(56) References Cited

U.S. PATENT DOCUMENTS

| | | | |
|---|---|---|---|
| 4,355,420 A | 10/1982 | Ishihara | |
| 5,012,208 A | 4/1991 | Makinen et al. | |
| 5,862,466 A * | 1/1999 | Erickson | 455/321 |
| 5,937,340 A * | 8/1999 | Philippe et al. | 455/310 |
| 6,167,247 A | 12/2000 | Kannell et al. | |
| 6,711,396 B1 | 3/2004 | Bergsma et al. | |
| 6,836,240 B1 | 12/2004 | Dubbert et al. | |
| 7,027,793 B2 * | 4/2006 | Gard et al. | 455/318 |
| 7,280,805 B2 | 10/2007 | Xu et al. | |
| 2002/0049043 A1 | 4/2002 | Gamliel | |
| 2003/0210182 A1 | 11/2003 | Hanson et al. | |
| 2007/0042742 A1 | 2/2007 | Kim et al. | |
| 2007/0075793 A1 * | 4/2007 | Maxim et al. | 331/74 |

OTHER PUBLICATIONS

International Application PCT/IB2010/052070 Search report dated Nov. 16, 2010.
Blount et al., "A High IP3, Subharmonically Pumped Mixer for LMDS Applications", 22nd Annual Gallium Arsenide Integrated Circuit (GaAs IC) Symposium, pp. 171-174, Seattle, USA, Nov. 5-8, 2000.
Choi et al., "Broadband uniplaner balanced subharmonic mixer", Electronics Letters Journal, vol. 41, issue 2, pp. 74-76, Jan. 20, 2005.
Hittie Microwave Corporation, "HMC 266, GaAs MMIC Sub-Harmonically Pumped Mixer, 20-40 GHz", Version 07.0907, USA, Jan. 16, 2008.
Lanschutzer et al., "A Digital Adaptive Feedback Loop for Local Oscillator Leakage Cancellation and DC Offset Compensation", 2002 Asia-Pacific Microwave Conference (APMC 2002), Kyoto, Japan, Nov. 19-22, 2002.

\* cited by examiner

*Primary Examiner* — Yuwen Pan
*Assistant Examiner* — Fatuma Sherif
(74) *Attorney, Agent, or Firm* — Sterne, Kessler, Goldstein & Fox PLLC

(57) ABSTRACT

A frequency conversion system includes a mixer, which is coupled to mix an input signal with a Local Oscillator (LO) signal, so as to produce an output signal. Control circuitry is configured to adjust an actual level of the LO signal provided to the mixer, so as to maintain the actual level substantially constant. A nulling signal generator is coupled to inject a nulling signal into the input signal prior to mixing with the LO signal adjusted by the control circuitry.

39 Claims, 2 Drawing Sheets

EFFICIENT REDUCTION OF LOCAL OSCILLATOR LEAKAGE

FIELD OF THE INVENTION

The present invention relates generally to frequency conversion, and particularly to methods and systems for reducing Local Oscillator (LO) leakage.

BACKGROUND OF THE INVENTION

Frequency conversion devices, such as mixers and quadrature modulators, convert the frequency of an input signal by mixing it with a Local Oscillator (LO) signal. In some cases, the LO signal may leak to the output of the device and appear as a spurious signal. This effect is referred to as LO leakage, and is generally undesirable.

Various techniques for reducing LO leakage are known in the art. For example, U.S. Pat. No. 5,012,208, whose disclosure is incorporated herein by reference, describes a quadrature modulator comprising a circuit for compensating for an LO leak signal in an output signal of the modulator. The circuit adds different compensation voltages to two modulation signals. To provide automatic compensation of the LO leak signal, the quadrature modulator comprises a regulating circuit that regulates the intensity of the compensation voltages irrespective of each other, on the basis of the correlation between the amplitude variation in the output signal and the corresponding modulation signal.

U.S. Pat. No. 6,711,396, whose disclosure is incorporated herein by reference, describes a method for reducing LO leakage in radio frequency mixers. Compensating circuits are used to reduce or eliminate unwanted leakage from the mixer output signal by controlling the current in individual branches of a balanced input circuit of the mixer. The compensating circuits are made of different combinations of resistor, transistor and current sink components. By using the compensating circuits with a radio frequency mixer, DC current differential occurring between two output nodes of the input circuit are reduced or eliminated.

U.S. Pat. No. 4,355,420, whose disclosure is incorporated herein by reference, describes a frequency converter having first, second and third terminals that receive a first signal having a first frequency band, a LO signal, and a second signal having a second frequency band. The first signal and the LO signal are mixed to generate the second signal. A first branching circuit is connected between the second terminal and the frequency mixer, for branching part of the LO signal. A first part of the branched LO signal, which is supplied from the first branching circuit, and a first leaked LO signal are applied from the frequency mixer to the first terminal. The phase and amplitude of the first branched LO signal are adjusted so that the first branched LO signal and the first leaked LO signal have equal amplitude and are reversed in phase to cancel each other.

U.S. Pat. No. 6,167,247, whose disclosure is incorporated herein by reference, describes a method for reducing the level of an undesired signal, generated through a frequency converter device. A feedback correction loop, for a radio frequency transmitter or receiver, reduces an undesired LO leak generated through a single-input frequency converter device, such as a mixer. A nulling circuit is also implemented for a multiple-input frequency converter device, such as a quadrature modulator.

U.S. Pat. No. 7,280,805, whose disclosure is incorporated herein by reference, describes a method for calibrating a Radio Frequency (RF) transmitter. The method includes inputting a test tone to the RF transmitter. LO leakage calibration is performed on an output of the RF transmitter with the test tone inputted thereto, in order to determine a minimum LO leakage. Thereafter, sideband image calibration is performed on the output of the RF transmitter with the test tone inputted thereto, in order to determine a minimum sideband image.

Lanschützer et al. describe a technique for adaptive compensation of LO leakage and direct Current (DC) offset, in "A Digital Adaptive Feedback Loop for Local Oscillator Leakage Cancellation and DC Offset Compensation," Proceedings of the 2002 Asia-Pacific Microwave Conference (APMC 2002), Kyoto, Japan, Nov. 19-22, 2002, which is incorporated herein by reference. The technique is intended for use in direct up-conversion transmitters.

SUMMARY OF THE INVENTION

An embodiment of the present invention provides a frequency conversion system, including a mixer, which is coupled to mix an input signal with a Local Oscillator (LO) signal, so as to produce an output signal. Control circuitry is configured to adjust an actual level of the LO signal provided to the mixer, so as to maintain the actual level substantially constant. A nulling signal generator is coupled to inject a nulling signal into the input signal prior to mixing with the LO signal adjusted by the control circuitry.

In a disclosed embodiment, the control circuitry is configured to maintain the actual level at a target level that causes the nulling signal, when mixed with the LO signal by the mixer, to reduce leakage of the LO signal into the output signal.

In some embodiments, the nulling signal is pre-configured in the nulling signal generator in a calibration process. Typically, wherein the calibration process measures leakage of the LO signal into the output signal while driving the mixer with the LO signal at the substantially constant level.

Additionally or alternatively, the nulling signal generator is coupled to adjust the nulling signal based on temperature. The nulling signal generator may be coupled to adjust the nulling signal according to a pre-configured setting or using an adaptive loop.

In some embodiments, the system includes an amplification chain having an adjustable gain, which is configured to amplify the LO signal and provide the amplified LO signal to the mixer, wherein the control circuitry is configured to adjust the actual level by modifying the gain of the amplification chain. In one embodiment, the control circuitry includes a detector, which is coupled to measure the actual level of the LO signal provided to the mixer, and the control circuitry is configured to modify the gain of the amplification chain responsively to the actual level measured by the detector. Typically, the control circuitry includes a comparator, which is coupled to produce a comparison between the actual level and a target level, and the control circuitry is configured to modify the gain of the amplification chain responsively to the comparison. Additionally or alternatively, the control circuitry further includes a reference detector, and is configured to modify the gain of the amplification chain responsively to a difference between respective outputs of the detector and the reference detector.

Further additionally or alternatively, the amplification chain includes at least a first component fabricated on a first semiconductor die, and at least a second component fabricated on a second semiconductor die, different from the first die.

In a disclosed embodiment, the control circuitry is configured to maintain the actual level at a substantially constant target level, and to accept external reconfiguration of the target level.

There is also provided, in accordance with an embodiment of the present invention, a frequency conversion system, including a mixer, which is operative to mix an input signal with a Local Oscillator (LO) signal, so as to produce an output signal. A nulling signal generator is coupled to generate an electrical current signal that reduces leakage of the LO signal into the output signal when mixed with the LO signal by the mixer, and is coupled to superimpose the electrical current signal onto the input signal so as to generate a superimposed signal, and to provide the superimposed signal to the mixer over a single interface.

In a disclosed embodiment, the nulling signal generator includes at least one high-impedance current source, which is coupled to produce the electrical current signal.

Additionally or alternatively, the nulling signal generator is coupled to apply a positive voltage offset to the electrical current signal. Typically, an operating point of the mixer is selected responsively to the positive voltage offset.

In one embodiment, the mixer is fabricated on a first semiconductor die, and the nulling signal generator in fabricated on a second semiconductor die, different from the first die.

The nulling signal generator may be coupled to adjust the electrical current signal so as to minimize the leakage of the LO signal into the output signal.

There is additionally provided, in accordance with an embodiment of the present invention, a frequency conversion method, which includes using a mixer, mixing an input signal with a Local Oscillator (LO) signal to produce an output signal. An actual level of the LO signal provided to the mixer is adjusted, so as to maintain the actual level substantially constant. A nulling signal is injected into the input signal prior to mixing with the adjusted LO signal.

There is further provided, in accordance with an embodiment of the present invention, a frequency conversion method, which includes mixing an input signal with a Local Oscillator (LO) signal, using a mixer, to produce an output signal. An electrical current signal is generated that reduces leakage of the LO signal into the output signal when mixed with the LO signal by the mixer. The electrical current signal is superimposed onto the input signal so as to generate a superimposed signal, and the superimposed signal is provided to the mixer over a single interface.

The present invention will be more fully understood from the following detailed description of the embodiments thereof, taken together with the drawings in which:

DETAILED DESCRIPTION OF EMBODIMENTS

Overview

Figure 1:
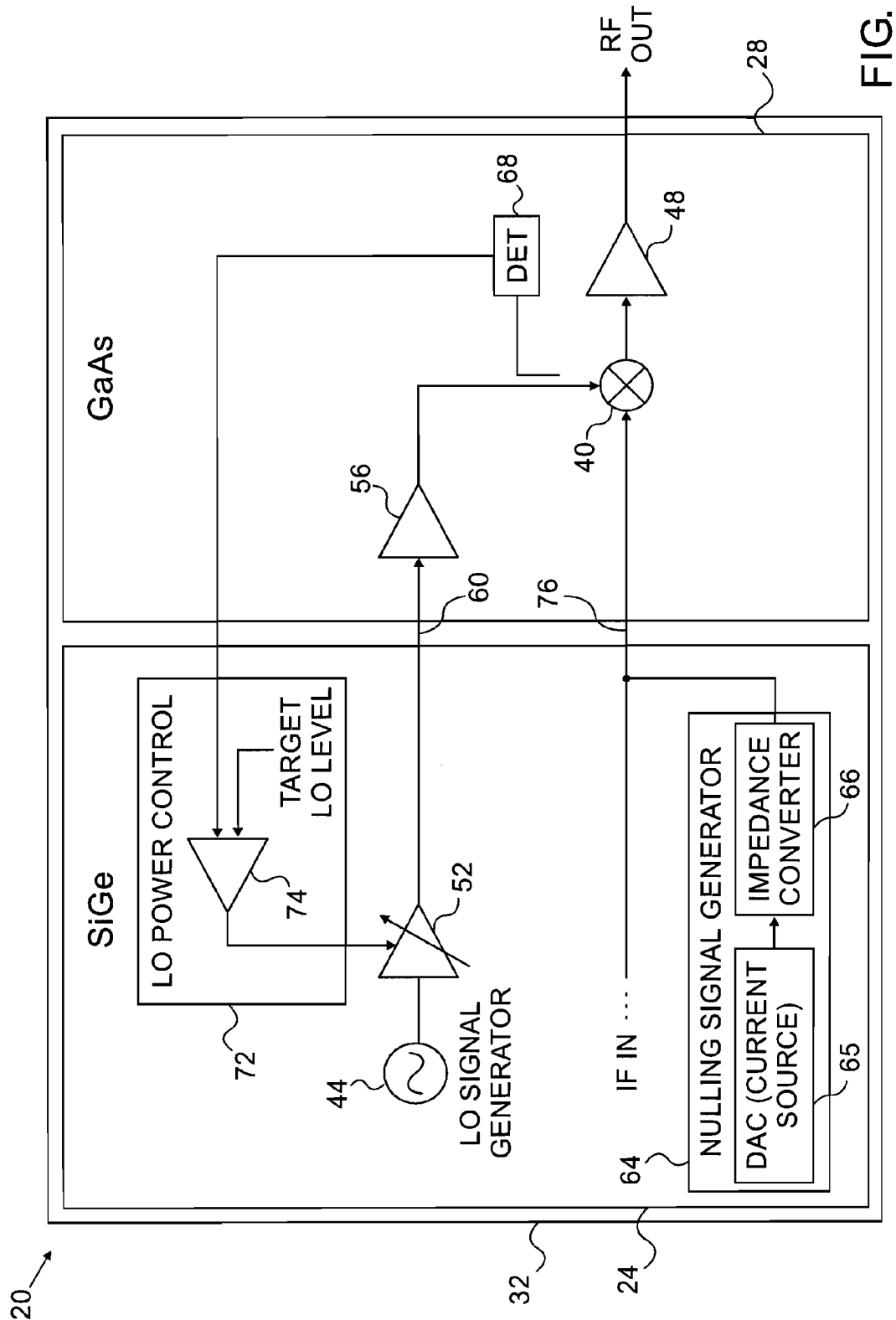
FIG. 1 is a block diagram that schematically illustrates a frequency conversion system, in accordance with an embodiment of the present invention.

Embodiments of the present invention that are described hereinbelow provide improved methods and systems for reducing LO leakage effects in frequency conversion devices, such as mixers and quadrature modulators. In the disclosed methods and systems, a low-frequency (typically DC) nulling signal is applied to the input of the frequency conversion device, together with an input signal whose frequency is to be converted. The phase and amplitude of the nulling signal are set so that, when the frequency conversion device mixes the nulling signal and input signal with the LO signal, the level of LO leakage in the output signal is reduced. In some embodiments, the nulling signal is adjusted in response to temperature changes.

In some frequency conversion devices, however, the LO cancellation depth (i.e., the amount of reduction in LO leakage for a given nulling signal) is sensitive to variations in frequency and temperature, and to the power level of the LO signal provided to the frequency conversion device. If the LO signal level varies (e.g., over operating conditions or due to manufacturing process variations), the phase and/or amplitude of the LO signal may not match those of the nulling signal, and LO leakage cancellation may become ineffective. In some cases, the properties of the DC nulling signal are adjusted individually per unit, e.g., in a production line calibration process.

In some embodiments of the present invention, the level of the LO signal provided to the frequency conversion device is controlled using a closed control loop. The loop attempts to maintain the LO signal at a constant target level, typically a level that achieves optimal nulling. In a typical implementation, a detector measures the actual level of the LO signal that is provided to the frequency conversion device. The measured actual level is compared to the target level, and the actual LO level is adjusted based on the comparison result. The actual LO level can be adjusted, for example, by modifying the gain of an amplification chain that amplifies the LO signal before providing it to the frequency conversion device.

In some system configurations, it is desirable to minimize the number of interfaces (e.g., pins or circuit traces) that are used for providing signals to the frequency conversion device. In some embodiments of the present invention, the nulling signal is superimposed onto a single input interface that also provides the input signal to the frequency conversion device. In order to enable direct connection of the nulling signal to the input signal without loading the input interface, the nulling signal is produced using one or more high-impedance current sources. Because of the high impedance of the current sources, this sort of signal can be directly superimposed onto the input signal without loading effects. The nulling signal and input signal are then provided to the frequency conversion device over the same single interface.

The techniques described herein are particularly advantageous in systems that produce the LO, IF and nulling signals in one module (e.g., a certain semiconductor die) and perform frequency conversion in another module (e.g., a separate die). In such an implementation, the LO signal is typically amplified by a high-gain amplification chain and routed between the two modules. As such, the actual LO level provided to the frequency conversion device may vary considerably from unit to unit and over time. The disclosed closed-loop control scheme enables the system to achieve accurate LO nulling in the presence of these variations. Superimposing a current-based nulling signal onto the input signal is also advantageous in dual-module configurations, since the number of interface lines between the two modules is reduced. Generally, however, the disclosed methods and systems are in no way limited to dual-module configurations, and are applicable to a wide range of frequency conversion systems.

System Description

FIG. 1 is a block diagram that schematically illustrates a frequency conversion system 20, in accordance with an embodiment of the present invention. In the present example, system 20 is fabricated on two separate semiconductor dies, a Silicon-Germanium Bipolar Complementary Metal Oxide Semiconductor (SiGe BiCMOS) die 24 and a Gallium-Arsenide (GaAs) die 28. This sort of partitioning is advantageous in many applications. For example, low-frequency and analog circuitry can often be implemented in a straightforward manner and at low cost using CMOS and SiGe Heterojunction Bipolar Transistor (HBT) processes on a silicon substrate. GaAs substrates and processes, on the other hand, are often more suitable for implementing high-frequency circuitry. Thus, in system 20, low-frequency and logic functions are generally implemented on SiGe BiCMOS die 24, whereas high-frequency functions are generally implemented on GaAs die 28. In some embodiments, dies 24 and 28 are packaged in a common device package 32.

System 20 up-coverts an input Intermediate Frequency (IF) signal into an output Radio Frequency (RF) signal. System 20 can be used, for example, in a communication transmitter, e.g., a microwave or millimeter-wave transmitter. Alternatively, system 20 can be used in various other applications that involve frequency conversion, such as in test equipment, medical imaging systems, radar systems and electronic warfare systems.

Depending on the application, the IF signal may have any suitable frequency (e.g., baseband in some embodiments), and the RF signal may have any suitable frequency that is higher than the IF signal frequency. In an example up-converter implementation for a microwave transmitter, the IF signal is in the range DC-4 GHz and the RF signal is in the range 6-40 GHz, although any other suitable values can also be used. In communication applications, the IF signal typically comprises a modulated, data-carrying signal that is produced by a modem and initially up-converted to IF. The specific elements that are used for producing the IF signal are, however, not mandatory to the understanding of the present invention, and have been omitted from the figure for the sake of clarity.

System 20 comprises a mixer 40, which up-converts an input differential I/Q IF signal using a Local Oscillator (LO) signal produced by a LO signal generator 44. The mixer mixes the IF signal with the LO signal, so as to produce the output RF signal. An amplifier 48 amplifies the RF signal, and the amplified signal is provided as output of the system.

As can be seen in the figure, LO signal generator 44 resides on SiGe BiCMOS die 24, whereas mixer 40 resides on GaAs die 28. The LO signal produced by generator 44 is amplified by an amplification chain, in the present example comprising a Variable-Gain Amplifier (VGA) 52 and an amplifier 56. The LO signal is routed from die 24 to die 28 over an interface 60, e.g., bond wires, ESD pads and/or transmission lines. Generally, the LO amplification chain may comprise any desired number of amplifiers and other components, which may reside on die 24 and/or on die 28.

In some cases, the LO signal provided to mixer 40 may leak to the mixer output, and appear as a spurious signal in the output RF signal. This effect is well-known in the art and is referred to as LO leakage. This sort of distortion in the RF signal is generally undesirable, and therefore it is desired to minimize LO leakage as much as possible.

System 20 reduces LO leakage by injecting a DC nulling signal to the differential I/Q IF signal provided to mixer 40. The nulling signal is produced by a nulling signal generator 64. When the DC nulling signal is up-converted by the mixer, its frequency coincides with the frequency of the LO signal. Generator 64 sets the amplitude and phase of the nulling signal so that after up-conversion (at the mixer output) the nulling signal and the leaked LO signal have substantially equal amplitudes and opposite phases. Thus, the up-converted nulling signal cancels the leaked LO signal, and the LO level in the output RF signal is reduced considerably.

Optimal LO Nulling Using Closed-Loop Control of LO Signal Level

As can be appreciated, the performance of the LO nulling process depends on the accuracy at which the up-converted nulling signal matches the phase and amplitude of the leaked LO signal. In some mixers, this accuracy is often sensitive to the level of the LO signal provided to mixer 40. For a given nulling signal, the LO nulling depth may vary considerably as a function of the LO signal level at the mixer's LO terminal.

The actual level of the LO signal provided to the mixer may vary over a wide range. In system 20, for example, the LO signal is amplified by a high-gain amplification chain before reaching the mixer. The gain is especially high, since it compensates for the losses associated by routing the LO signal across two dies. The gain of the LO amplification chain may vary, for example, over frequency, over temperature, over supply voltage, from unit to unit, due to component aging or for any other reason. In the amplification chain of FIG. 1, which may have a gain in the range of 30 dB, gain variations of ±6 dB are not uncommon. In order to achieve high-performance LO nulling, however, the LO level should typically be maintained within a range of approximately ±0.5 dB at the mixer terminals. (Note, however, that these numerical values are shown by way of example, and that the techniques described herein are in no way limited to those values.)

In some embodiments, system 20 comprises closed-loop control circuitry, which attempts to maintain the LO signal level substantially constant in the presence of the above-mentioned gain variations. The loop typically modifies the gain of the LO signal amplification chain in order to maintain the LO signal at the desired level.

Typically, system 20 comprises a temperature-compensated power detector 68 (e.g., a diode-based detector), which measures the actual level of the LO signal that is provided to mixer 40. A LO power control module 72 accepts the measured LO level from detector 68. Based on the measured actual LO level, module 72 modifies the gain of VGA 52, so as to maintain the actual LO signal level at a substantially constant level.

In the example of FIG. 1, module 72 comprises a comparator 74, which compares the measured LO level with a certain target level. The target level is typically preset at a value known to yield accurate LO nulling. Module 72 adjusts the gain of VGA 52 based on the output of comparator 74, so that the actual LO signal level converges to the target level. The target level can be determined using any suitable method, such as using a-priori calibration. In alternative embodiments, any other configuration of module 72 can be used. For example, the functions of module 72 may be implemented using digital processing logic. In some embodiments, module 72 can be configured externally to set or modify the target level.

In some embodiments, detector 68 is designed to exhibit little or no process variations and variations over operating conditions (e.g., temperature and voltage). Measurement variations in detector 68 can be reduced, for example, by using an additional detector (not shown in the figure) as reference. Detector 68 and the reference detector are similar in design and are typically mounted in close proximity to one another. The reference detector, however, is terminated and not provided with a signal to measure. Since operating conditions are expected to cause similar measurement variations in the two detectors, the difference between the outputs of the two detectors can be used as a variation-free measurement.

In alternative embodiments, any other suitable control circuitry can also be used. For example, instead of a using a VGA, the amplification chain may comprise a variable attenuator whose attenuation is modified by module 72.

By adaptively maintaining the LO signal level near the target level, system 20 compensates for the sensitivity of mixer 40 to LO signal level variations. As a result, the nulling signal produced by generator 64 is able to effectively reduce LO leakage over a wide range of operating conditions and process variations.

In some embodiments, nulling signal generator 64 adjusts the nulling signal as a function of temperature. The adjustment may be carried out using a pre-configured (predefined or pre-calibrated) setting. For example, the nulling signal generator may measure the current temperature and adjust the nulling signal based on the measured temperature. Alternatively, the adjustment may be carried out in an adaptive manner, e.g., using a closed loop that measures the LO leakage at the mixer output and adjusts the nulling signal to minimize it.

Direct Injection of Nulling Signal into Input Signal

In system 20, the IF signal and nulling signal are produced on die 24, and are routed to die 28 over an interface 76. In a configuration of this sort, it is advantageous to combine the nulling signal and the IF signal on die 24, and then route the combined signals to die 28 over a single interface.

In some embodiments, nulling signal generator 64 comprises one or more current sources, which generate an electrical current signal representing the nulling signal. Since a current source typically has high output impedance, its output can be connected directly to another signal without introducing undesirable loading.

Thus, as can be seen in FIG. 1, the current-based nulling signal produced by generator 64 is superimposed directly onto the IF signal. The combined nulling signal and IF signal are routed to mixer 40 on die 28 over a single interface. This solution reduces the number of interconnections between dies 24 and 28. As a result, the size and cost of system 20 is reduced, noise levels are lower, and reliability is increased.

(The term "single interface" is used herein to describe an interface that transfers a single signal waveform, which may be differential, common mode or single-ended. A single interface may comprise, for example, a coaxial cable, a stripline or microstrip trace, a bond wire or pad or a pair of differential circuit traces or wires.)

In the example of FIG. 1, generator 64 comprises a Digital-to-Analog Converter (DAC) 65 and an impedance converting network 66. DAC 65 operates as a current source, and converts a predefined digital value into an analog current. Impedance conversion network 66 converts the DAC current-based output to support lower output impedance, typically on the order of 100Ω. In alternative embodiments, any other suitable configuration of nulling signal generator can also be used.

In a typical configuration, both the nulling signal and the IF signal comprise differential signals. In this configuration, generator 64 comprises a differential configuration of two current sources, which together produce a differential, current-based nulling signal. The differential nulling signal is superimposed directly onto the differential IF signal, and the combined signals are routed to die 28 over a single differential interface (e.g., a pair of pads or circuit traces).

Typically, SiGe BiCMOS circuitry operates using all-positive voltages. GaAs circuitry, on the other hand, usually operates using both positive and negative voltages, centered on 0V. The use of differential nulling signal overcomes the mismatch in operating voltages between the two semiconductor technologies.

In order to provide effective LO nulling, it is generally desirable to produce nulling signals at any desired phase and amplitude. In particular, some nulling phases involve generating a negative nulling signal. In some embodiments, generator 64 applies to the current-based nulling signal a certain positive offset voltage, which is typically set to the middle of the SiGe operating voltage range. Mixer 40 on die 28 is operated accordingly around this positive voltage offset. This technique enables system 20 to operate with positive and negative nulling signals, even though the SiGe circuitry supports only positive voltages.

When the nulling signal is differential, a positive constant common-mode voltage component is added to the signal. Typically, the operating point of mixer 40 on die 28 is chosen appropriately, so as to prevent this common-mode voltage from affecting the mixer performance.

In some embodiments, generator 64 adjusts the phase and/or amplitude of the nulling signal, in order to compensate for temperature variations or other errors. This sort of control attempts to maintain the nulling signal at a certain phase and amplitude at the input of mixer 40, regardless of varying operating conditions or process variations. The nulling signal can be controlled using a closed loop (such as the loop used for LO signal level control). For example, the nulling signal can be measured using a suitable detector adjacent to the mixer input, and the detector's output can be used to correct the nulling signal produced by generator 64. Alternatively, the nulling signal can be controlled using an open loop. For example, generator 64 may correct the nulling signal according to a pre-calibrated table, which lists correction values as a function of temperature or other operating conditions.

System 20 may be fabricated and packaged in one or more RF Integrated Circuits (RFICs). Alternatively, some or all elements of system 20 may be implemented using discrete components. Various components that are not mandatory for demonstrating the principles of the present invention have been omitted from the figure for the sake of clarity.

The configuration of system 20 shown in FIG. 1 is an example configuration, which is chosen purely for the sake of conceptual clarity. In alternative embodiments, any other suitable configuration can also be used. For example, alternatively to mixer 40, the disclosed techniques can be used with any other type of frequency conversion device, such as a quadrature modulator comprising one or more mixers. Although FIG. 1 shows a system that is partitioned between a SiGe BiCMOS die and a GaAs die, the system may alternatively be implemented using any desired number of dies of any desired type or material composition, and the different system functions may be partitioned among the dies in any suitable manner. The disclosed techniques are also applicable to single-die configurations.

Frequency Conversion Method Descriptions

Figure 2:
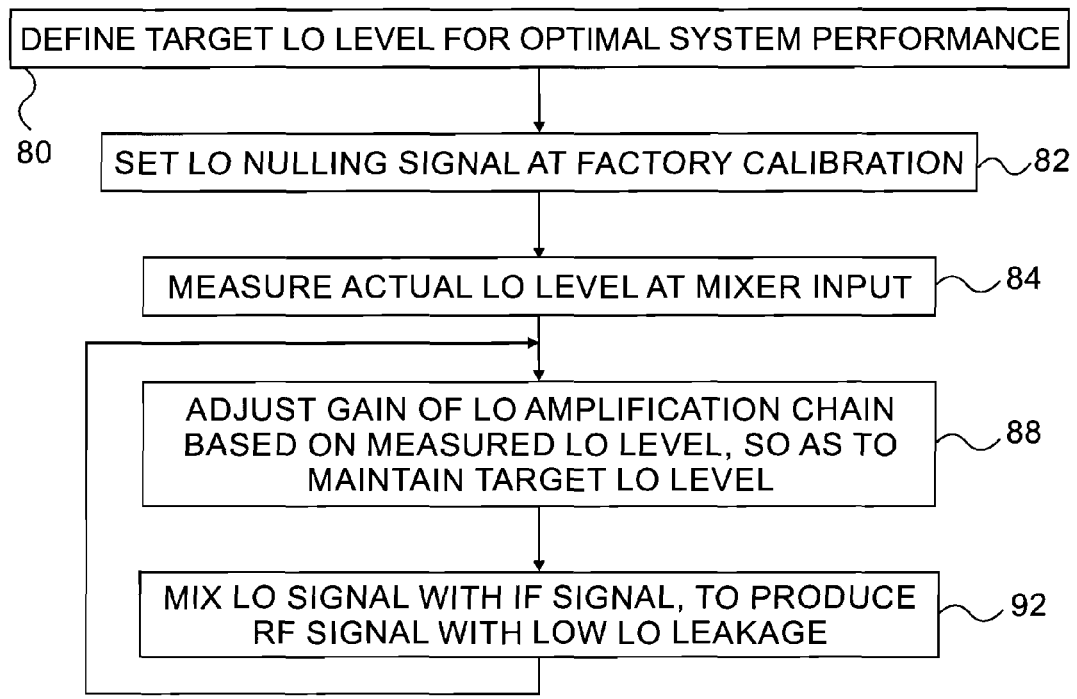
FIGS. 2 and 3 are flow charts that schematically illustrate methods for frequency conversion, in accordance with embodiments of the present invention.

FIG. 2 is a flow chart that schematically illustrates a method for frequency conversion, in accordance with an embodiment of the present invention. The description that follows refers to two processes that take place in parallel—an LO nulling process and a closed-loop process that maintains the LO signal level at a constant target level. In the present example, the LO nulling process is performed in open-loop, in the sense that the properties of the LO nulling signal are set during factory calibration. As such, the LO nulling process is typically sensitive to variations in the LO signal level. The closed-loop LO level setting process maintains the LO signal at a constant target level (which is substantially the same LO level used during factory calibration), and therefore enables the LO nulling process to provide its expected performance.

The method of FIG. 2 begins by defining a certain target value for the LO level provided to mixer 40, at a target level definition step 80. The LO target level is set to a value that yields optimal performance of system 20. Control module 72 may be configured with the target LO level, e.g., during production. During factory calibration of system 20, a calibration setup (not shown) determines an optimal setting (e.g., amplitude and/or phase) of the LO nulling signal, at a nulling signal configuration step 82. The calibration setup determines the nulling signal setting that best cancels the LO signal, assuming that mixer 40 is provided with the target LO signal level defined at step 80 above. Nulling signal generator 64 is typically configured with the optimal nulling signal setting during factory calibration.

During operation of system 20, detector 68 measures the actual LO signal level at the LO terminal of mixer 40, at a LO measurement step 84. Module 72 adjusts the gain of the LO amplification chain based on the measured LO level, at a gain adjustment step 88. Typically, module 72 modifies the gain such that the actual LO level reaches the target level defined at step 80. In the example of FIG. 1, module 72 modifies the gain by controlling VGA 52. Mixer 40 mixes the IF and nulling signal with the LO signal, at a mixing step 92. Since the LO level is maintained at or near the target level, LO nulling is performed at substantially the same level used during factory calibration. As a result, LO nulling is highly accurately, and the level of leaked LO in the output RF signal is reduced.

Figure 3:
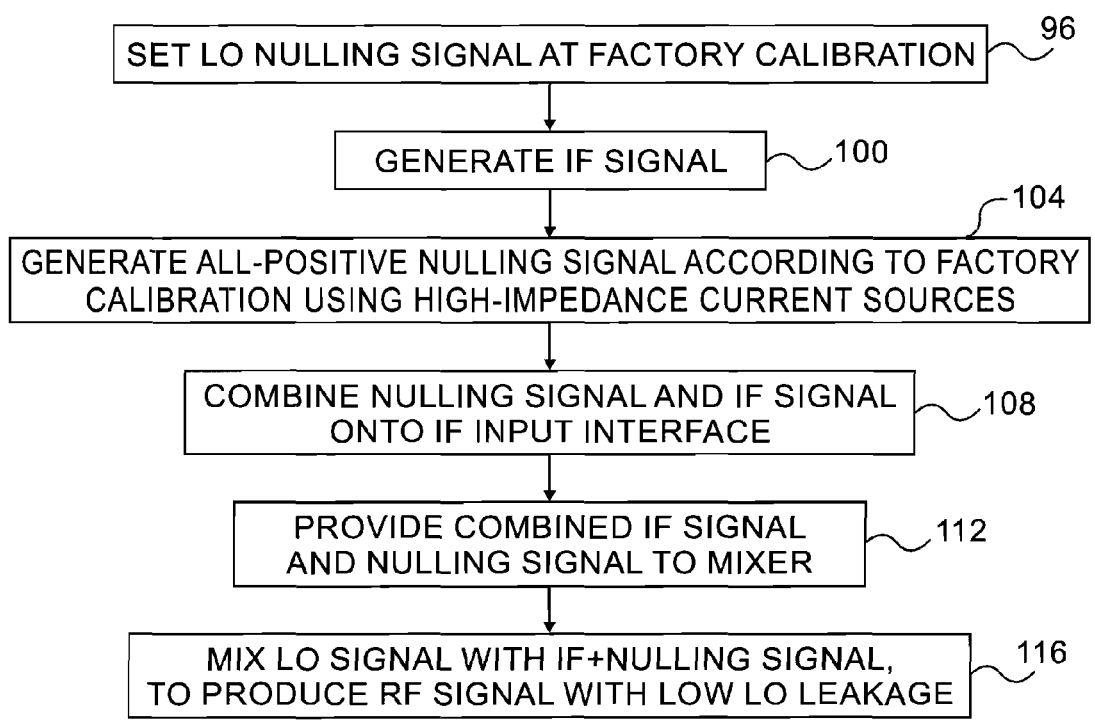

FIG. 3 is a flow chart that schematically illustrates a method for frequency conversion, in accordance with an embodiment of the present invention. The method begins by determining an optimal setting (e.g., amplitude and/or phase) of an LO nulling signal during factory calibration, at a nulling calibration step 96. The optimal LO nulling signal setting is typically configured in nulling signal generator 64.

During operation of system 20, the system accepts or generates an IF signal, at an IF input step 100. Generator 64 generates an all-positive current-based signal, according to the optimal setting configured during factory calibration, at a nulling generation step 104. The nulling signal and the IF signal are superimposed directly onto a single (possibly differential) interface, at a superposition step 108. Since the current sources in generator 64 have high output impedance, this connection does not load the interface. The combined nulling signal and IF signal are provided to mixer 40 over the single interface, at a routing step 112. The mixer mixes the IF and nulling signal with the LO signal, at a mixing step 116.

Although the embodiments described herein mainly address nulling of LO signals, the methods and systems described herein can also be used in other applications, such as in sideband suppression.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A frequency conversion system, comprising:
a mixer configured to mix an input signal with a Local Oscillator (LO) signal to produce an output signal, the output signal including leakage of the LO signal;
control circuitry configured to:
measure a level of the LO signal, and
adjust the level of the LO signal to maintain the level of the LO signal substantially constant at a predetermined target level that is selected to initiate nulling of the LO signal; and
a nulling signal generator configured to inject a nulling signal into the input signal, the nulling signal being characterized as having a substantially equal amplitude and a substantially opposite phase as the leakage of the LO signal when mixed with the LO signal.

2. The system according to claim 1, wherein the nulling signal generator is further configured to adjust the nulling signal based on temperature.

3. The system according to claim 1, further comprising:
an amplification chain, having an adjustable gain, configured to amplify the LO signal to provide an amplified LO signal to the mixer, wherein the control circuitry is further configured to modify the adjustable gain to adjust the level of the LO signal.

4. The system according to claim 3, wherein the control circuitry comprises:
a detector configured to measure the level of the LO signal, wherein the control circuitry is further configured to modify the adjustable gain responsively to the level of the LO signal measured by the detector.

5. The system according to claim 4, wherein the control circuitry further comprises:
a comparator configured to compare the level of the LO signal with the predetermined target level, and wherein the control circuitry is further configured to modify the adjustable gain responsively to the comparison.

6. The system according to claim 4, wherein the control circuitry further comprises:
a reference detector configured to modify the adjustable gain responsively to a difference between respective outputs of the detector and the reference detector.

7. The system according to claim 3, wherein the amplification chain comprises:
a first component fabricated on a first semiconductor die; and
a second component fabricated on a second semiconductor die, the second semiconductor die being different from the first semiconductor die.

8. A frequency conversion system, comprising:
a mixer configured to mix an input signal with a Local Oscillator (LO) signal to produce an output signal;
a nulling signal generator configured to:
generate an electrical current signal that reduces leakage of the LO signal into the output signal when the input signal is mixed with the LO signal by the mixer, the electrical current signal being characterized as having a substantially equal amplitude and a substantially opposite phase as the leakage of the LO signal when mixed with the input signal,
superimpose the electrical current signal onto the input signal to generate a superimposed signal, and
provide the superimposed signal to the mixer over a single interface; and control circuitry configured to:
measure a level of the LO signal, and
adjust the level of the LO signal to maintain the level of the LO signal substantially constant at a predetermined target level that is selected to initiate nulling of the LO signal.

9. The system according to claim 8, wherein the nulling signal generator comprises:
a high-impedance current source configured to produce the electrical current signal.

10. The system according to claim 8, wherein the nulling signal generator is further configured to apply a positive voltage offset to the electrical current signal.

11. The system according to claim 10, wherein an operating point of the mixer is selected responsively to the positive voltage offset.

12. The system according to claim 8, wherein the mixer is fabricated on a first semiconductor die, and wherein the nulling signal generator is fabricated on a second semiconductor die, the second semiconductor die being different from the first semiconductor die.

13. The system according to claim 8, wherein the nulling signal generator is further configured to adjust the electrical current signal to minimize the leakage of the LO signal into the output signal.

14. A frequency conversion method, comprising:
mixing, by a mixer, an input signal with a Local Oscillator (LO) signal to produce an output signal, the output signal including leakage of the LO signal;
measuring a level of the LO signal provided to the mixer;
adjusting the level of the LO signal to maintain the level of the LO signal substantially constant at a predetermined target level that is selected to initiate nulling of the LO signal; and
injecting a nulling signal into the input signal prior to mixing the input signal with the adjusted LO signal, the nulling signal being characterized as having a substantially equal amplitude and a substantially opposite phase as the leakage of the LO signal when mixed with the LO signal.

15. The method according to claim 14, further comprising:
pre-configuring the nulling signal by measuring the leakage of the LO signal while driving the mixer with the LO signal at the predetermined target level.

16. The method according to claim 14, wherein injecting the nulling signal comprises:
adjusting the nulling signal based on temperature.

17. The method according to claim 14, wherein adjusting the level of the LO signal comprises:
amplifying the LO signal with an amplification chain, having an adjustable gain, to provide an amplified LO signal to the mixer; and
modifying the adjustable gain.

18. The method according to claim 17, wherein modifying the adjustable gain comprises:
adjusting the adjustable gain responsively to the measured level of the LO signal.

19. The method according to claim 18, wherein adjusting the adjustable gain comprises:
producing a comparison between the level of the LO signal and the predetermined target level, and wherein modifying the adjustable gain comprises:
modifying the adjustable gain responsively to the comparison.

20. The method according to claim 18, wherein modifying the adjustable gain comprises:
modifying the adjustable gain responsively to a difference between respective outputs of a detector configured to measure the level of the LO signal and a reference detector.

21. The method according to claim 17, further comprising:
fabricating a first component of the amplification chain on a first semiconductor die; and
fabricating a second component of the amplification chain on a second semiconductor die, the second semiconductor die being different from the first semiconductor die.

22. A frequency conversion method, comprising:
measuring a level of a Local Oscillator (LO) signal provided to a mixer;
adjusting the level of the LO signal to maintain the level of the LO signal substantially constant at a predetermined target level that is selected to initiate nulling of the LO signal;
generating an electrical current signal that reduces leakage of the LO signal into an output signal when an input signal is mixed with the LO signal by the mixer, the electrical current signal being characterized as having a substantially equal amplitude and a substantially opposite phase as the leakage of the LO signal when mixed with the input signal;
superimposing the electrical current signal onto the input signal to generate a superimposed signal; and
mixing, by the mixer, the superimposed signal with the LO signal to produce the output signal.

23. The method according to claim 22, wherein generating the electrical current signal comprises:
producing the electrical current signal using a high-impedance current source.

24. The method according to claim 22, wherein generating the electrical current signal comprises:
applying a positive voltage offset to the electrical current signal.

25. The method according to claim 24, wherein mixing the superimposed signal with the LO signal comprises:
operating the mixer at an operating point that is selected responsively to the positive voltage offset.

26. The method according to claim 22, further comprising:
fabricating the mixer on a first semiconductor die; and
fabricating a signal generator to generate the electrical current signal on a second semiconductor die, the second semiconductor die being different from the first semiconductor die.

27. The method according to claim 22, wherein generating the electrical current signal comprises:
adjusting the electrical current signal to minimize the leakage of the LO signal into the output signal.

28. A frequency conversion system, comprising:
a first semiconductor die having a plurality of first elements mounted thereon, the first elements comprising:
a local oscillator (LO) signal generator configured to generate a LO signal,
a variable-gain amplifier coupled to the LO signal generator,
control circuitry coupled to the variable-gain amplifier, wherein the control circuitry is configured to:
receive a signal indicating a level of the LO signal,
compare the level of the LO signal with a predetermined target level configured to initiate nulling of the LO signal, and
adjust a gain of the variable-gain amplifier such that the level of the LO signal converges with the predetermined target level, and a nulling signal generator configured to generate a nulling signal; and a second semiconductor die having a plurality of second elements mounted thereon, the second elements comprising:

a mixer coupled to an output of the variable-gain amplifier and to an output of the nulling signal generator, wherein the mixer is configured to up-convert an input signal using the LO signal, and a detector coupled to the mixer and to the control circuitry, wherein the detector is configured to:

detect the level of the LO signal, and generate the signal indicating the level of the LO signal.

29. The frequency conversion system of claim 28, wherein the first semiconductor die is a Silicon-Germanium die.

30. The frequency conversion system of claim 28, wherein the second semiconductor die is a Gallium-Arsenic die.

31. The frequency conversion system of claim 28, wherein the nulling signal generator is configured to set an amplitude and a phase of the nulling signal such that, after the mixer up-converts the input signal, the nulling signal and a leaked LO signal have substantially equal amplitudes and substantially opposite phases.

32. The frequency conversion system of claim 28, wherein the detector is a temperature-compensated power detector configured to detect a change in temperature, and wherein the control circuitry is configured to modify the gain of the variable-gain amplifier in response to the change in temperature.

33. The frequency conversion system of claim 28, wherein the second semiconductor die further comprises:

a second amplifier coupled to an output of the variable-gain amplifier and to an input of the mixer; and a third amplifier coupled to an output of the mixer.

34. The frequency conversion system of claim 28, wherein the predetermined target level is a preset value calibrated to cause the nulling signal generator to generate the nulling signal such that the nulling signal initiates optimal LO nulling.

35. The frequency conversion system of claim 28, wherein the nulling signal generator is configured to generate the nulling signal at an offset voltage set to a middle of an operating voltage range of the first semiconductor die.

36. The frequency conversion system of claim 28, wherein the nulling signal generator is further configured to correct the nulling signal according to a plurality of correction values that are functions of temperature or other operating conditions.

37. The frequency conversion system of claim 28, wherein the nulling signal generator is further configured to:

inject the nulling signal into the input signal.

38. The frequency conversion system of claim 28, wherein the nulling signal generator is configured to generate the nulling signal using a high-impedance current source.

39. The frequency conversion system of claim 28, wherein the nulling signal generator is configured to superimpose the nulling signal onto the input signal.

* * * * *